United States Patent [19]

Deckert et al.

[11] Patent Number: 4,515,829

[45] Date of Patent: May 7, 1985

[54] THROUGH-HOLE PLATING

[75] Inventors: Cheryl A. Deckert, Framingham; Edward C. Couble, Brockton; William F. Bonetti, Boston, all of Mass.

[73] Assignee: Shipley Company Inc., Newton, Mass.

[21] Appl. No.: 542,036

[22] Filed: Oct. 14, 1983

[51] Int. Cl.$^3$ .......................... H05K 3/42; H05K 3/46
[52] U.S. Cl. ..................................... 427/97; 156/668; 427/98; 427/306; 427/307
[58] Field of Search ................... 427/97, 98, 306, 307; 156/668

[56] References Cited

U.S. PATENT DOCUMENTS 4,054,693 10/1977 Leech ................................. 427/305
4,425,380 1/1984 Nuzzi ................................... 427/98

Primary Examiner—John D. Smith
Attorney, Agent, or Firm—Robert L. Goldberg

[57] ABSTRACT

Compositions and process for the plating of through-holes in an epoxy printed circuit board base material in the manufacture of printed circuit boards. The treatment process is designed to increase adhesion between the epoxy board material and a subsequently deposited metal plate. The process is characterized, in part, by the use of an activated permanganate solution.

20 Claims, No Drawings

THROUGH-HOLE PLATING

BACKGROUND OF THE INVENTION

1. Introduction

This invention relates to the formation of through-hole and multilayer printed circuit boards using an epoxy printed circuit board base material, and more particularly, to an electroless metal plating process for the fabrication of such boards employing a pretreatment sequence including contact with an activated permanganate solution.

2. The prior art

When preparing printed circuit boards having more than one circuit pattern, conductive holes, known in the art as through-holes, pass through the board to accommodate insertion and soldering of electrical component leads and to make electrical connections between two or more circuit patterns. Conductive through-holes are conventionally introduced by drilling or punching holes through a copper clad, rigid board followed by a plating procedure. The holes usually plated by a copper reduction procedure known in the art as electroless copper plating such as disclosed by Coombs, Jr., "Printed Circuits Handbook", McGraw-Hill Book Co., N.Y., N.Y., 1967, chapter 5 and by Draper, "Printed Circuits and Electronic Assemblies", Robert Draper, Ltd. Teddington, 1969, Chapter 6, both incorporated herein by reference. The copper clad board with plated through-holes can be processed into printed circuit boards using resists and processes such as those disclosed in the aforementioned "Printed Circuit Handbook" or, for example, in any of U.S. Pat. Nos. 3,469,982; 3,526,504; 3,547,730; 3,622,344 and 3,837,860, all incorporated herein by reference. As is known in the art, the copper reduction process involves pretreatment with a catalytic solution catalytic to the deposition of an electroless metal such as a tin-palladium colloid, followed by electroless metal plating, typically an electroless copper deposition solution. Processes of this nature are disclosed in U.S. Pat. No. 3,011,920 incorporated herein by reference.

Printed circuit board failure often occurs as a consequence of poor adhesion of the metal plated onto the sidewalls of the through holes. There are several causes of poor adhesion. For example, when a through-hole is drilled through the board, a substantial temperature increase occurs at the interface between the drill bit and the wall of the through hole as a consequence of friction. This results in melting of the plastic substrate at its interface with the drill bit. The melted plastic on the surface of the hole wall forms in a smooth smear over the surface of the hole which is poorly adsorptive of plating catalyst. Another cause of poor adhesion is the presence of minute particles of the plastic formed during the drilling or punching operation. These particles can interfere with the bond between the metal plate and the wall of the through hole. When a circuit board base material comprising glass filled epoxy is used as the circuit board base material, the fibrils of the glass fiber often protrude into the hole and interfere with the bond between the subsequently deposited metal and the side wall of the hole.

An advance in the art of printed board manufacture was the introduction of the multilayer board where multiple circuits are stacked in layers on a circuit board and pressed into a multilayer board. Each circuit is separated from another by a layer of a dielectric material. In a manner similar to the double sided through-hole circuit board, holes are formed in the multilayer stack to form interconnections between the same.

Adhesion of copper to sidewalls of through-holes is more critical in the manufacture of multilayer boards than in the manufacture of the two sided through-hole board. However, because there are a stack of multiple circuits, through-hole plating is more difficult than through-hole plating of double sided boards and good and consistent adhesion of the copper to the sidewall is more difficult to achieve.

Another problem in the manufacture of multilayers is epoxy smear over the copper of the copper circuit protruding into the through-hole. For electrical contact between the inner layer circuit and the metal on the hole wall, there must be contact between the two. The epoxy smear often acts as a dielectric preventing this contact. Consequently, treatments such as sulfuric acid or chromic acid etching or plasma etching have been used to remove this smear. However, these treatments smooth the hole-walls further increasing the problem of adhesion of a metal plate to the sidewall of the hole.

SUMMARY OF THE INVENTION

The invention described herein is a process for metal plating the side-walls of through-holes in the manufacture of printed circuit boards using epoxy resin printed circuit board base materials. The process results in reproducible copper to epoxy bonds that are sufficiently strong to minimize rejects in printed circuit board manufacture. The invention is applicable to the manufacture of both double-sided printed circuit boards and multilayer circuit boards.

The process of the invention utilizes a combination of pretreatment steps including an optional first step of plasma or wet etching to desmear the holes as in the prior art, followed by the inventive steps of treatment with an oxygenated epoxy solvent to remove epoxy particles and to open the surface of the epoxy to penetration by subsequent treatment solutions, treatment with an activated permanganate solution to activate the walls of the holes, and contact with a solution of a reducing agent to reduce retained permanganate ions. Each step uses solutions and conditions of use that provide the results described.

The solvent pretreatment is at an elevated temperature using an oxygenated water soluble solvent for epoxy resin, preferably diluted with water. The permanganate solution is one that is activated by high pH and used at an elevated temperature. The reducing step preferably uses an amine reducing solution that effectively removes permanganate ions from the surface of the treated part.

The combination of steps described, together with the conventional steps involved in metal plating, reproducibly produce an epoxy to metal bond strength of at least 2 pounds per linear inch following the procedures of IPC Test Method No. 2.4.8, Peel Strength, Metal Foil and leaves essentially all metal retained on the surface of an epoxy part following plating as determined by the procedures of IPC Test Method No. 2.4.26 Tape Test for Additive Printed Circuits.

DESCRIPTION OF THE PREFERRED EMBODIMENTS

In accordance with the invention, the substrate used for the fabrication of a printed circuit board is any epoxy substrate conventionally used for such purpose. Typically, the epoxy substrate is filled with glass fibers and copper clad on at least one of its surfaces. As is known in the art, the epoxy can be substituted or mixed with other resins for specific purposes.

In the manufacture of a double-sided printed circuit board, a first step comprises the formation of through-holes by drilling, punching or any other method known to the art. Following formation of the holes, it is desirable to employ the conventional steps of desmearing the holes by sulfuric acid or plasma etching followed by glass etching. Thereafter, the processing sequence of the subject invention is employed.

The first step, in accordance with the invention, comprises treatment of the walls of the holes with an oxygenated epoxy solvent selected from the group of ketones, ethers and ether alcohols. Preferred solvents include, by way of example, acetone, methylethyl ketone, Methyl Cellosolve, Butyl Carbitol, Butyl Carbitol acetate, Butyl Cellosolve and Butyl Cellosolve acetate.

The epoxy solvent may be used as a 100% solution, but is preferably an alkaline aqueous solution to decrease the attack on the surface of the epoxy. Preferably, the solvent is diluted with water whereby the solvent comprises from 10 to 70% of the solution and more preferably, from 15 to 40% of the solution.

As above, the solution is preferably an alkaline solution having an alkaline normality of from 0.05 to 0.80 N and more preferably, from 0.10 to 0.5 N. Any source of alkalinity is suitable, hydroxides and amines being preferred. Regardless of the strength of the solvent solution, to obtain peel strengths consistently over 2 pounds per linear inch, the solvent solution is desirably used at an elevated temperature of at least 110° F., and preferably, at a temperature ranging between about 130° F. and 165° F. The treatment may be by either immersion of the part in a solution of the solvent or by spraying. The time of contact with the solvent solution is dependent upon the strength of the solvent used and its temperature and may vary from about 1 minute to 10 minutes, but more conventionally, varies from about 3 to 8 minutes.

Following contact of the epoxy circuit board base material with the solvent, the part is water rinsed and treated with a permanganate solution. The permanganate solution used is one preferably by having a pH higher than that conventionally used for the treatment of plastics for decorative plating. In the prior art, it has been taught that permanganate solutions may be used to pretreat plastics at a pH up to about 13, though a pH within the range of 11 to 13 is reported to be desirable. Though a pH within this range is operative, when combined with the other steps of the pretreatment process of the invention a reproducible peel strength exceeding 2 pounds per linear inch is not obtainable from part to part unless the permanganate solution is activated by an elevated pH exceeding 13. Accordingly, in accordance with the subject invention, the pH should exceed 13 and should range between about 13.1 and 13.6. Moreover, harsh treatment conditions are desirable with the temperature of the permanganate solution being maintained elevated, preferably in excess of 140° F. and preferably ranging between about 165° F. and 200° F. The immersion time in the permanganate solution may vary from about 2 to 20 minutes and preferably varies between about 3 and 10 minutes.

It should be noted that the preferred operating pH may result in a decreased permanganate stability. However, the concomittant increase in peel strength and the consistency in the results obtained by the process of the subject invention more than offset the disadvantage of reduced permanganate stability.

Any metal salt of permanganate that is stable and soluble to the extent of at least 2 grams per liter in water can be used to form the permanganate solution of the invention, but it is preferred to use an alkali metal salt, e.g., a salt of sodium, potassium, lithium or cesium, etc., or an alkaline earth metal salt, e.g., a salt of calcium, etc. as the permanganate salt. Especially preferred because of ready availability at reasonable cost and good solubility are sodium and potassium permanganates. The concentration of the permanganate in solution preferably varies between 10 to 100 grams per liter and more preferably, varies between 20 and 50 grams per liter.

The pH of the permanganate solution can be controlled by the addition of a base. A suitable base is a hydroxide having a common ion with the permanganate salt. Sodium and potassium hydroxides are preferred. A buffer can be added to the permanganate solution, and it has been found that peel strength is increased if a buffer is included in the formulation. Those buffers known to the art are suitable, phosphates, borates and carbonates being examples of suitable buffering compounds.

In addition to buffers, the permanganate solutions can also contain conventional wetting agents to improve the wettability of the treatment solution.

Following treatment with the permanganate solution, the epoxy circuit board base material is water rinsed and preferably treated with an aqueous acidic solution of a reducing agent. This agent reduces any manganese residues left on the surface of the part following water rinsing. Typical reducing agents include aqueous solutions of stannous ions, bisulfite ions, hydroxylamine, sugars, etc. The solution is acidified to dissolve the manganese residues which are insoluble in alkaline solution. The part is immersed in an aqueous solution containing from about 0.5 to 25 grams of the reducing agent per liter of solution and then water rinsed to remove residual manganese residues left on the surfaces of the hole sidewalls. Treatment of the reducing agent is preferable for from about 1 to 10 minutes at a temperature of from 130° F. to 180° F.

A suitable reducing solution is disclosed in copending U.S. patent application Ser. No. 578,872 filed Feb. 1, 1984, assigned to the same assignee as the subject application and incorporated herein by reference. The reducing solution, in a preferred embodiment of the invention of said copending application, comprises an aqueous acid solution of a hydroxyl substituted lower molecular weight amine and an alkylene perfluoroalkyl sulphonate. The concentration of the pefluoro compound various between about 0.1 and 20 grams per liter of solution.

Following the pretreatment sequence described above, the through-holes of the epoxy printed circuit board base material are ready for metallization and may be processed into circuit boards in accordance with conventional art recognized procedures. For example, the next step in the conventional process would involve catalysis with a known plating catalyst. The most commonly used catalyst is that formed by the reduction of palladium with tin in a strongly acidic solution. Such catalysts are disclosed in U.S. Pat. No. 3,011,920. Following catalysis, it is conventional to apply a step of acceleration which comprises treating the circuit board base material with a mild acid solution believed to dissolve stannic acid colloids on the surface of the catalyst to activate the same as described in the aforesaid U.S. Pat. No. 3,011,920.

Following catalysis, the part is metal plated with a conventional electroless copper plating solution. Typical electroless copper plating solutions suitable for purposes of the subject invention include those disclosed in U.S. Pat. Nos. 3,765,936; 3,728,137; and 3,661,597, all incorporated herein by reference. Other electroless copper plating solutions known to those skilled in the art would also be suitable for purposes of the subject invention.

The process of the subject invention is especially useful for the manufacture of through-hole and multilayer printed circuit boards by both additive and subtractive techniques. Procedures for the formation of printed circuit boards are described in numerous publications, for example, in Coombs, *Printed Circuit Handbook*, referenced above.

In a typical process for the manufacture of a printed circuit board, a suitable base material would be copper clad epoxy filled with glass fibers. Holes are drilled or punched at appropriate locations on the board and the walls of the holes are metallized with copper to provide electrical contact between the two surfaces of the circuit board base material. The method for metallizing the holes in accordance with this invention would include the steps of solvent treatment with the oxygenated epoxy solvent described above for a period of about five minutes at a temperature varying between 130° F. and 165° F., oxidation with the permanganate solution described above by a treatment for about five minutes at a temperature from about 170° F. to 190° F. and reduction of the permanganate with the reducing solution described above for about five minutes at a temperature from about 150° F. to 170° F. Thereafter, the epoxy board may be treated with a glass etchant to remove fibrils extending into the holes, catalyzed with a tin/palladium catalyst, treated with an accelerator and metal plated with a conventional electroless copper plating solution.

Following metallization of the holes, utilizing a process known as pattern plating, a copper pattern would be formed on the copper by application of an organic resist material which may be either a photoresist or a screen resist, dependent upon the desired design and definition. The resist coats the copper that is not part of the conductor pattern and leaves the copper bare in a conductor pattern. Thickness of the copper pattern may be increased using electroless copper plating procedures optionally followed by electrolytic copper plating. Following copper plating, a dissimilar metal etch resist such as solder may be applied over the copper in the conductor pattern to protect the same from subsequently applied etchant, the organic resist is removed exposing unwanted copper (not part of the conductor pattern) and the unwanted copper would be dissolved with a suitable etchant for the copper such as a peroxide sulfuric acid etchant. Typically, the dissimilar metal etch resist is selected not only for its ability to withstand the etchant, but also for its solderability so that electrical connections can be soldered directly to the etch resist.

A multilayer board is made by a similar process except that pre-formed circuits are stacked on top of each other and coated with a dielectric layer. The stack is pressed and heated and holes are then drilled and plated as described above.

The invention will be better understood by reference to the examples which follow:

EXAMPLE 1

Preferred treatment solutions in accordance with the invention are as follow:

| Ingredient | Concentration | |
|---|---|---|
| a. Solvent solution | | |
| Butyl carbitol | 190 | grams |
| Surfactant | 10 | grams |
| Sodium hydroxide | 14 | grams |
| Water | to 1 | liter |
| Oxidizing solution | | |
| Potassium permanganate | 40 | grams |
| Sodium hydroxide | 30 | grams |
| Surfactant | 0.5 | grams |
| Water | to 1 | liter |
| Reducing solution | | |
| Hydroxylamine sulfate | 5 | grams |
| Surfactant | 10 | grams |
| Sulfuric acid | 40 | ml |
| Water | to 1 | liter |

The formulations set forth above constitute the preferred embodiments of the invention.

EXAMPLE 2

A series of 6 epoxy circuit board base test parts identified as FR-4 boards by Norplex were cut to a size measuring 2"×4". The parts were treated by the following process sequence:

a. drill through-holes at desired locations;
b. desmear and etch by immersion in a 98% sulfuric acid solution maintained at 70° F. for 20 seconds and water rinse;
c. immerse in the solvent solution of example 1 maintained at between 140° F. and 150° F. for five minutes and water rinse;
d. immerse in the oxidizing solution of example 1 maintained at between 175° F. and 185° F. for five minutes and water rinse;
e. immerse in the reducing solution of example 1 maintained at a temperature of between 160° F. and 170° F. for five minutes and water rinse;
f. immerse in cleaner conditioner 1175 of Shipley Company for 5 minutes at a temperature of from 150° to 160° F. and water rinse;
g. immerse in a solution of a micro etch identified as Preposit 746 Etch for 2 minutes at 110° F. and water rinse;
h. immerse in a pre-drip solution identified as Cataposit 404 for 1 minute and water rinse;
i. immerse in catalyst identified as Cataposit 44, 3% solution, for 4 minutes at 115° F. and water rinse;
j. immerse in accelerator identified as Accelerator 19 for 7 minutes at room temperature and water rinse; and
k. immerse in an electroless copper plating solution identified as CP-78 Electroless Copper for 20 minutes at 110° F. and water rinse.

The copper deposit on the side walls of the through-holes was approximately 80 micro inches in thickness.

The bond strength between the epoxy circuit board base material and the copper plate on the surface of the part was determined by the above identified IPC Tape test. For each of the 6 epoxy parts plated, it was found that in excess of 99% of the copper adhered to the epoxy substrate establishing that the bond strength exceeded 2 pounds per linear inch.

EXAMPLES 3 AND 4

The procedure of example 2 was repeated. For one series of parts, the pH of the permanganate solution was maintained at 12.8 and for a second series of parts, the pH was maintained at 13.4. The pH used and the bond strength obtained, as determined by the percentage of copper retained on the epoxy surface, are set forth in the following table:

| Example No. | pH | % Copper on Board |
|---|---|---|
| 3 | 12.8 | 50 |
| 4 | 13.4 | 99 |

EXAMPLE 5

The procedure of example 2 was repeated, but the step of solvent treatment (step c above) was omitted. The percentage of copper retained on the surface of the epoxy part following the adhesion test was 5%.

EXAMPLE 6

The procedure of example 2 was repeated, but the step of treatment with the permanganate solution and with the reducing solution (step d and e above) were omitted. The percentage of copper retained on the surface of the epoxy part was 5%.

We claim:

1. A process for the manufacture of a printed circuit board having a plurality of metal plated holes interconnecting at least two circuits comprising the steps of, in either order, forming holes in an epoxy printed circuit board material and forming the circuits and thereafter, metallizing the holes, said metallization comprising a pretreatment sequence between the steps of forming the holes and metal plating including the steps of contact of the holes with a first aqueous alkaline solution of an oxygenated epoxy solvent at a pH greater than 10 and at a temperature and for a time sufficient to soften the hole walls, contact with a second solution comprising an aqueous alkaline solution of permanganate ions maintained at an elevated temperature and a pH in excess of 13, and contact with a third solution of a reducing agent for permanganate ions at a temperature and for a time sufficient to remove any manganese residues remaining on the walls of the holes.

2. The process of claim 1 where the oxygenated epoxy solvent is an aqueous alkaline solution of an oxygenated organic solvent for epoxy, where the solvent comprises from 10 to 70 percent by volume of the solution and has a pH greater than 10.

3. The process of claim 2 where the pH of the permanganate solution varies between 13.1 and 13.6.

4. The process of claim 3 where the concentration of the permanganate ions in solution varies from about 10 to 100 grams per liter.

5. The process of claim 3 where the permanganate ion is derived from an alkali or alkaline earth metal permanganate salt.

6. The process of claim 5 where the permanganate ion is derived from potassium permanganate.

7. The process of claim 6 where the permanganate solution is at a temperature exceeding 140° F.

8. The process of claim 7 where the temperature varies between 160° F. and 200° F.

9. The process of claim 8 where a buffer for the permanganate solution is selected from the group of compounds of phosphate; carbonate and borate.

10. The process of claim 9 where the buffer is a phosphate compound.

11. The process of claim 3 where the oxygenated solvent is a solvent selected from the group of ketones, ethers and ether alcohols.

12. The process of claim 11 where the solvent is an aqueous alkaline solution of an aliphatic ether.

13. The process of claim 11 where the solvent is an aqueous alkaline solution of Butyl Carbitol.

14. The process of claim 11 where the treatment temperature with the solvent varies between 130° F. and 165° F.

15. The process of claim 11 where the reducing agent is an aqueous solution of a member from the group of bisulphites, stannous ions, hydroxylamine and sugar.

16. The process of claim 15 where the reducing agent is an acid solution of hydroxylamine sulfate.

17. The process of claim 15 where the treatment temperature of the reducing solution varies between about 130° F. and 165° F.

18. The process of claim 16 where the solution of the reducing agent contains a surfactant.

19. The process of claim 3 used for the manufacture of a double sided through-hole printed circuit board.

20. The process of claim 3 used for the manufacture of a multi-layered printed circuit board.

* * * * *